United States Patent [19]

Hammer et al.

[11] Patent Number: 5,102,776

[45] Date of Patent: Apr. 7, 1992

[54] METHOD AND APPARATUS FOR MICROLITHOGRAPHY USING X-PINCH X-RAY SOURCE

[75] Inventors: David A. Hammer; Daniel H. Kalantar, both of Ithaca; Nian-Sheng Qi, Freeville, all of N.Y.

[73] Assignee: Cornell Research Foundation, Inc., Ithaca, N.Y.

[21] Appl. No.: 433,896

[22] Filed: Nov. 9, 1989

[51] Int. Cl.$^5$ .............................................. G03C 5/00
[52] U.S. Cl. ......................................... 430/311; 430/5; 430/313; 430/297; 427/96; 378/24; 378/34; 378/119; 378/35
[58] Field of Search .................. 430/311, 313, 5, 297; 427/96; 378/24, 34, 119

[56] References Cited

U.S. PATENT DOCUMENTS

| | | | |
|---|---|---|---|
| 4,504,964 | 3/1985 | Cartz et al. | 378/119 |
| 4,536,884 | 8/1985 | Weiss et al. | 378/119 |
| 4,538,291 | 8/1985 | Iwamatsu | 378/119 |
| 4,589,123 | 5/1986 | Pearlman et al. | 378/119 |
| 4,635,282 | 1/1987 | Okada et al. | 378/34 |
| 4,663,567 | 5/1987 | Wong | 315/111.21 |
| 4,771,447 | 9/1988 | Saitoh et al. | 378/119 |
| 4,889,605 | 12/1989 | Asmus et al. | 156/345 |

FOREIGN PATENT DOCUMENTS 61-0262760  6/1986  Japan ...................................... 378/34

OTHER PUBLICATIONS

Lougheed et al., J. Appl. Phys. 65 (3), 1 Feb. 1989, p. 978.
Bailey et al., App. Phys. Letters (1/82), p. 33.
Clark et al., 5th Int. Con. on Particle Beams, 1983, p. 236.
Heuberger et al., Proc. SPIE, vol. 39, 1983, p. 221.
Kolomensky, Proc. on 5th Int. Conf. on High Power Particle Beams, 1983, p. 533.
Suzuki et al., J. Vac. Sci. Tech., Jan./Feb. 1986, p. 221.
Okada et al., J. Vac. Sci. Tech., Jan./Feb. 1986, p. 243.
Pepin et al., J. Vac. Sci. Tech., Jan./Feb. 1987, p. 27.
Hollman, J. Vac. Sci. Tech., Jan./Feb. 1988, p. 186.
Heuberger, J. Vac. Sci. Tech., Jan./Feb. 1988, p. 107.

Primary Examiner—Charles L. Bowers, Jr.
Assistant Examiner—Thomas R. Neville
Attorney, Agent, or Firm—Jones, Tullar & Cooper

[57] ABSTRACT

An x-ray microlithography method and apparatus for integrated circuit wafers is disclosed in which an isotropic x-ray source is formed at the cross point of two crossed conductors. When a high current is passed through the conductors they vaporize and breakdown to form an ionized plasma which is hot enough at the cross point that K-shell x-ray radiation is released uniformly in all directions. The magnetic pressure caused by the current flow at the cross point is strong enough to collapse or pinch the plasma radially so that the x-ray source spot is very small in size and can provide high resolution exposure of an integrated circuit photoresist pattern. Due to the isotropic nature of the x-ray source, multiple circuit wafers can be exposed with a single x-ray pulse by disposing them radially around the source. Sequential x-ray pulses can be obtained for a circuit wafer manufacturing line by employing mechanically mounted wires, crossed conductive liquid jets, or by employing a plurality of crossed conductor pairs disposed on a rolled substrate that is sequentially advanced into contact with current feeding conductors.

15 Claims, 2 Drawing Sheets

METHOD AND APPARATUS FOR MICROLITHOGRAPHY USING X-PINCH X-RAY SOURCE

BACKGROUND OF THE INVENTION

The present invention relates in general to the use of x-ray sources in microlithography for integrated circuits.

X-ray lithography of integrated circuit wafers involves the exposure of patterned photoresist on the wafers with a source of radiation to form desired circuit patterns. UV radiation has been used in the past for lithography. However, with the continuing trend toward smaller and smaller circuits, UV radiation is becoming unsuitable because it can not provide the necessary resolution for very small detailed circuit patterns. Researchers have thus begun to look toward other suitable sources of radiation for microlithography. Many experiments have been conducted with soft x-rays as one suitable alternative source. Synchrotron sources, pulsed laser sources and gas-puff z-pinch sources have been under study for this purpose. The synchrotron is very expensive and generates a high intensity, low divergence x-ray beam that provides a very narrow exposure field. This requires that the photoresist on a few centimeter diameter circuit wafer be scanned by the x ray beam to be fully exposed. Laser plasmas and gas-puff z-pinches are capable of producing high intensity pulses of x-rays, but when a wafer is placed far enough away from the source that resist exposure will be adequately uniform, the x-ray fluence on the photoresist is reduced to a point that many pulses are required to expose it. Further, the location of the x-ray emissions in z-pinch x-rays tends to be unpredictable which further tends to make them unsuitable for microlithography.

SUMMARY OF THE INVENTION

It is therefore the object of the present invention to provide an x-ray microlithography method and apparatus which is relatively inexpensive, provides high resolution and uniform irradiation and generates sufficient power to enable exposure with a single pulse.

It is another object of the present invention to provide an x-ray microlithography method and apparatus which can expose a large number of circuit wafers in a short period of time.

These and other objects of the invention are achieved through use of an x-pinch soft x-ray source which consists of two fine crossed wires stretched between the output electrodes of a pulsed power generator. Very high current on the order of 500-600 kA is passed through the wires to cause them to vaporize and then breakdown into an ionized plasma. At the point where the two wires cross, the combined currents flowing through the wires increase the magnetic pressure on the plasma four fold. The increased magnetic pressure at that point causes the ionized plasma to collapse radially and thereby form a very small diameter x-ray source at the center of the plasma. This x-ray source can be made to generate enough power to expose a photoresist on a circuit wafer in a single pulse at a distance of at least 20 cm from the source with better than 0.25 micron resolution. The x-ray source can thus be employed to expose a 15 cm diameter wafer nearly uniformly. Further, the source is essentially isotropic and thus several complete wafers can be irradiated by a single pulse simultaneously.

Once the crossed wires have been vaporized by the current pulse, clearly they cannot be used again to generate another x-ray pulse. Thus additional crossed pairs of wires must be placed sequentially in the source mechanism if it is desired to use the x-ray source repeatedly in an automated circuit wafer manufacturing line. To accommodate this, any suitable type of wire dispensing and mounting mechanism can be employed. Alternatively, conductive liquid jets which are positioned to intersect at the crossing point in the device can be utilized to provide the x-ray pulses. This type of arrangement is particularly advantageous because it does not require the mechanical placement of the crossed conductors for each sequential pulse of the x-ray source. In yet another form of the invention, crossed conductors can be painted or otherwise disposed on a nonconductive substrate, such as a sheet of plastic. A plurality of these crossed conductors can be disposed on a long roll of plastic which can be unrolled and positioned in the device as needed.

BRIEF DESCRIPTION OF THE DRAWINGS

The foregoing and additional objects, features and advantages of the present invention will become apparent to those of skill in the art from the following detailed description thereof, taken in conjunction with the accompanying drawings in which.

DETAILED DESCRIPTION OF THE PREFERRED EMBODIMENTS

Figure 1:
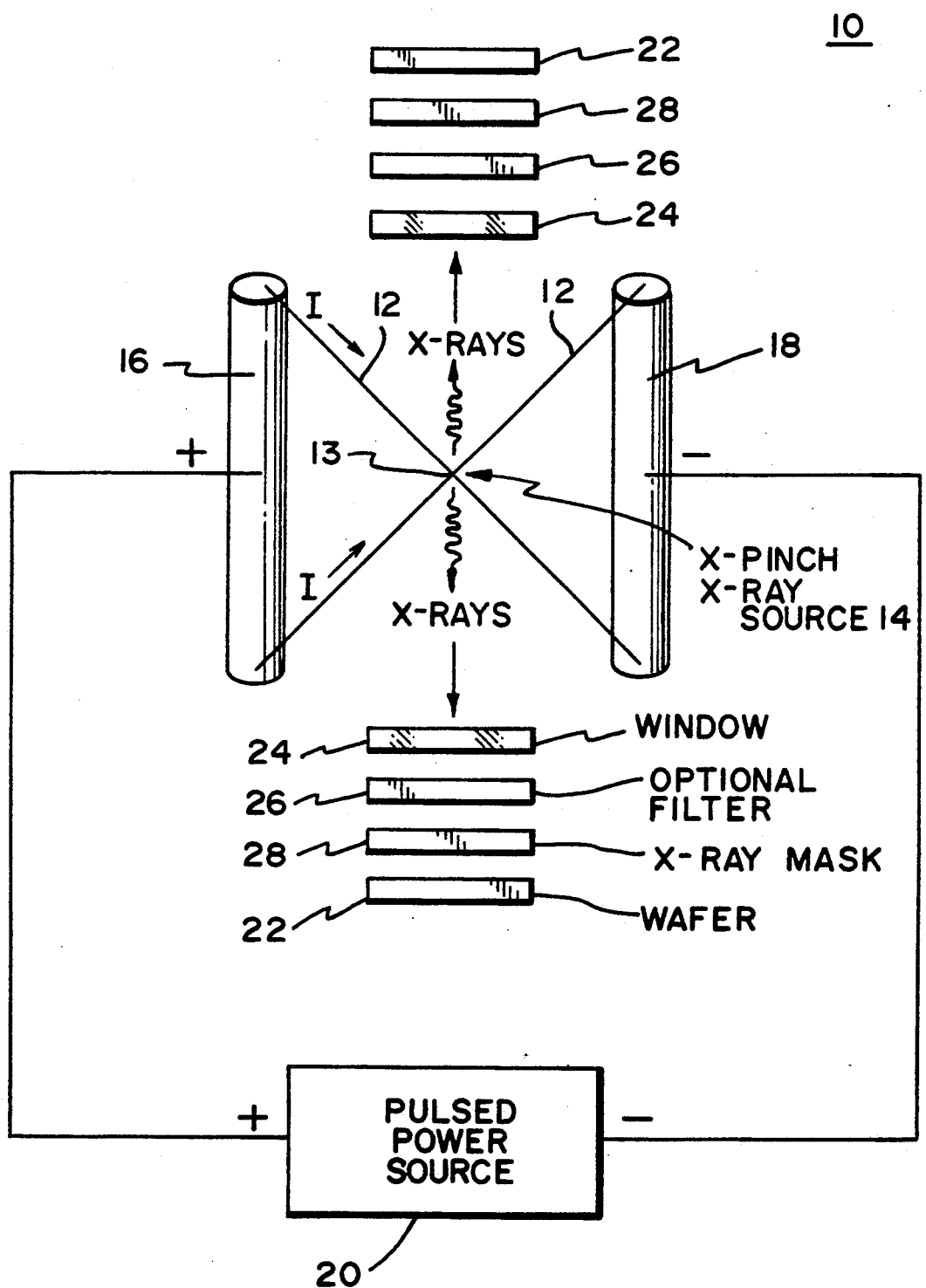
FIG. 1 is a diagrammatic illustration of a first embodiment of an x-ray microlithography arrangement configured in accordance with the present invention.

Turning now to a more detailed consideration of the invention, FIG. 1 illustrates the general arrangement and operation of the invention. In particular, an x-ray microlithography arrangement 10 is illustrated which includes a pair of crossed fine conductive wires 12 that may be formed of any suitable conductive material such as aluminum or magnesium. The wires 12 cross at a centrally located cross point 13 where they contact each other. Upon being energized by a large current, they will form an x-pinch x-ray source 14. Each of the wires 12 is connected between a positive power electrode 16 and a negative electrode 18 which serve to supply the large current from a suitable pulsed power source 20 to the wires 12. A plurality of photoresist coated integrated circuit wafers 22 to be exposed by the x-rays are positioned symmetrically about the x-pinch x-ray source 14. Although for convenience only two of the wafers 22 have been illustrated in FIG. 1, it will be understood that additional wafers could be symmetrically positioned about the x-ray source 14. Disposed between the x-ray source 14 and each of the wafers 22 are a beryllium or other weakly absorbing window 24 and an optional filter 26 which can be employed to modify the incident photon energy spectrum on the wafers. A plurality of conventional patterned photoresist x-ray masks 28 are positioned, one each, between each of the wafers 22 and the window 24 or the optional filter 26.

In the operation of the invention, a very large current on the order of 500,000-600,000 amps is supplied to the fine wires 12, and they immediately vaporize and ionize a path along the wires, turning them into a hot radiating plasma. This plasma contains the highest energy density at the cross point 13 where the combined magnetic fields from the currents I flowing in the wires 12 create a magnetic pressure that pinches the plasma down to a very small diameter and combines with the currents to form the x-pinch x-ray source 14. In an experiment using two 37-50 micron diameter aluminum wires and delivering a 500-600 kA 40 ns current pulse to the wires, 500 joules of aluminum K-shell x-ray radiation was obtained in all directions. The size of the x-pinch x-ray source 14 can be made a few tens of microns or less in size by a suitable choice of the detailed geometry at the cross point 13. In experiments where the crossed wires were barely touching, one or two x-ray source spots were observed, each of these spots being at most a few tens of microns in diameter. In another experiment, where the crossed wires were twisted together by 360' thereby increasing the contact area between the two, 5 or 6 similarly sized spots were observed. Even with 5 or 6 bright spots, the total x-ray source size was at most 0.5 mm in diameter. Such an arrangement can possess the capability to expose a medium sensitivity (50-100 mJ/cm$^2$) photoresist, such as polymethyl methacrylate (PMMA), in a single pulse at a distance of at least 20 cm from the source, with better than 0.25 micron resolution. Assuming source optimization increases the yield by a factor of two or more, a 15 cm diameter wafer could be irradiated with uniformity within 6% at a maximum angle of irradiation from the normal of 14' at a distance of 30 cm with a fluence 100 mJ/cm$^2$. At a distance of 20 cm, the x-pinch gives a penumbral blurring of only 0.05 micron for a mask-wafer gap of 20 microns. The x-pinch source size is small enough to achieve a resolution much less than 0.25 microns, even taking the multiple spot size of <0.5 mm (The single spot size of at most a few 10's of microns, would imply diffraction-limited resolution).

Though the photon energy of 1600 eV for the Al K-shell line radiation is higher than that obtained from, for example, a laser plasma source, suitable masks are available. Materials typically used for the x-ray mask 28 that minimizes out of plane distortions include silicon, SiC, boron nitride and SiN$_\gamma$ patterned with gold as an absorber material. The K edge in these Si based materials is at 6.8 angstroms (1840 eV). Therefore a mask membrane made from any of these materials has a high transparency at 1600 eV. A high flatness mask consisting of a 2 micron Si$_3$N$_4$ membrane with a 0.8 um Au absorber thickness, has a contrast for the Al K-line radiation of 20, and the aspect ratio is greater than 1. The blurring at the edge of a 5 cm diameter window is less than 20% for 0.5 micron linewidths. If instead, a mask contrast of 10:1 is required, the absorber thickness may be reduced to 0.6 microns. This allows the window to be enlarged to 7 cm in diameter without affecting the degree of blurring as the aspect ratio is reduced.

The intensity of 100 mJ/cm$^2$ at a distance of 20 cm is sufficient for the single pulse exposure of a 1 micron layer of resist such as PMMA, except that the photon energy is high enough that the x-rays are not efficiently absorbed in the resist. The placement of a 10 micron beryllium window and a mask with a 2 micron SiN$_\gamma$ membrane between the source and wafer are expected to reduce the lower bound intensity to approximately 60 mJ/cm$^2$. Even with an efficiency of exposure of 10%, this is enough energy to expose a higher sensitivity Novolak resist in a single pulse. Twisting the wires in the x-pinch or optimizing the single spot yield to get a higher total energy of K-shell radiation is expected either to allow the wafer to be placed further from the source, thereby giving higher resolution, or to permit use of a less sensitive resist at the 20 cm distance.

The flexibility of the x-pinch source may be used to improve the exposure of a wafer. The He-like Al K-shell line radiation has a wavelength of 7.8 angstroms. This may be varied by replacing the Al wires with another material, since the photon energy of the K-shell line radiation varies as Z$^2$. The total optimized K-shell emission is observed to increase with decreasing Z. Therefore, by introducing magnesium wires, it is expected that the total radiation produced will increase. The efficiency of absorption by the resist is also higher for lower photon energies. A higher resolution may then be obtained by placing the wafers further from the x-pinch.

The high intensity and isotropy of the x-ray emission from the x-pinch allows the simultaneous single pulse exposure of a number of wafers placed radially around the x-pinch where each will be equally irradiated. Furthermore, a pulsed power device with a repetition rate of 1 Hz and the necessary power and energy is within the present state-of-the-art of pulsed power technology. Therefore, an average throughput of at least one wafer per second is probably feasible for the arrangement of the present invention.

Figure 2:
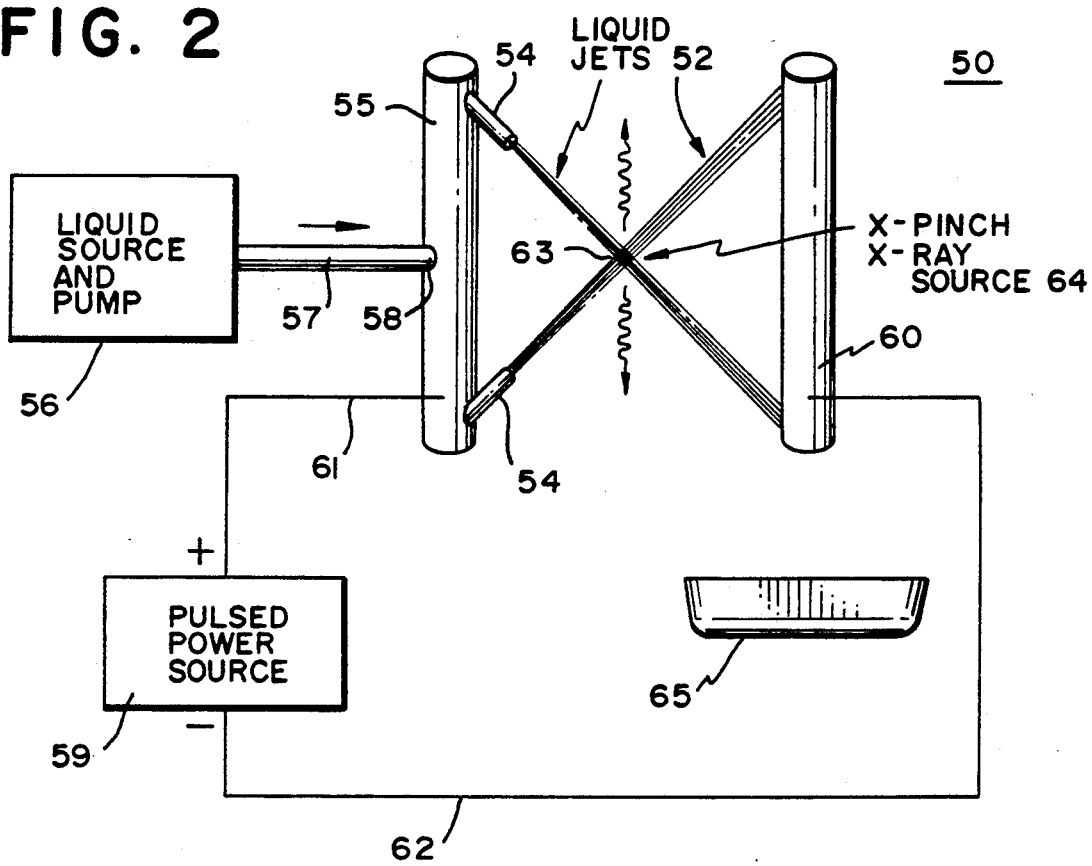
FIG. 2 is a diagrammatic illustration of a second embodiment of the present invention; and, FIG. 3 is a diagrammatic illustration of a third embodiment of the present invention.
Figure 3:
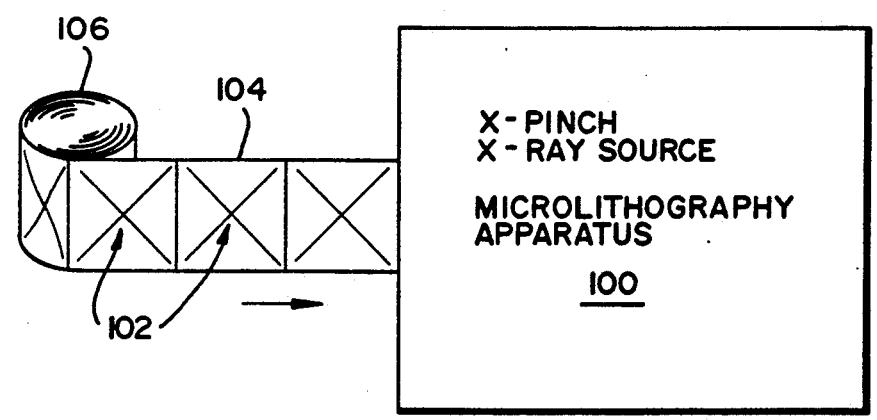

To use the x-ray source for sequentially exposing a plurality of wafers at this high rate, a means is needed to replace the crossed wires for each pulse since they are completely vaporized thereby. One way to accomplish this is simply to employ a conventional wire feeding and wrapping mechanism. However, two attractive alternatives from a cost, time and simplicity standpoint are illustrated in FIGS. 2 and 3. In particular, in FIG. 2, another x-pinch x-ray arrangement 50 is shown which is formed from a pair of crossed conductive liquid jets 52. The conductive liquid jets are discharged from a pair of nozzles 54 which are attached to a hollow cylindrical positive electrode 55. A liquid source and pump 56 supplies conductive liquid to the nozzles 54 through a line 57 that is attached to a fitting 58 on the positive electrode 55. A pulsed power source 59 supplies high current to the positive electrode 55 and to a negative cylindrical electrode 60 through a pair of lines 61 and 62, respectively.

Similar to the crossed wire embodiment of FIG. 1, the conductive liquid jets 52 are positioned to cross and partially contact one another at a central cross point 63 to form an x-pinch x-ray source 64. A catch pan 65 is positioned beneath the negative electrode 60 to receive any excess liquid from the jets 52, although it should be noted that the vaporization of the jets 52 by the current from the pulsed power source 59 will minimize any such excess.

The operation of the liquid jet embodiment of FIG. 2 is similar to that of the crossed wire embodiment of FIG. 1. When a high voltage pulse is applied from the pulsed power source 59 across the liquid jets 52, the jets vaporize and breakdown to form a plasma and x-ray emissions are generated at the cross point 63 due to the increased current flow at that point. As before, the pinch effect on the plasma causes it to be contracted resulting in the x-ray source 64 having a small source spot. The advantage of this design is that there are no wires to be mechanically replaced. It should be noted that almost any type of liquid can be used with this embodiment since the energizing voltage is so high that even a nonconducting liquid will become a conductor when exposed thereto. The type of liquid used will be governed by the type of x-ray radiation desired. Also, if desired, additional nozzles could be disposed in the negative electrode 60 so that four conductive jets which touch each other at the cross point 63 would be formed.

Turning now to FIG. 3, yet another embodiment of a multiple pulse x-pinch x-ray source is illustrated. In this embodiment, an x-pinch x-ray source microlithography apparatus 100 similar to that of FIG. 1 is sequentially supplied with a plurality of pairs of crossed wires 102 that are formed or otherwise disposed on a roll of nonconductive substrate 104. The substrate 104 is disposed on a feed roll 106 and is fed into the microlithography apparatus 100 by any suitable advancing means (not shown). As each of the crossed wires 102 are expended in the microlithography device 100 by the current, the substrate 104 is advanced to position the next crossed pair across the device electrodes as in FIG. 1.

Although the invention has been disclosed in terms of preferred embodiments, it will be understood that numerous modifications and variations could be made thereto without departing from the true spirit and scope thereof as defined by the following claims. For example, the x-pinch x-ray source could also be used for biological imaging. By employing carbon fibers in the x-pinch in place of Al or Mg wires, the dominant radiation will be carbon K-shell line radiation with a wavelength of about 40 angstroms (300 eV), which is suitable for biological uses. Single pulse images of cell structures would be possible with the same high resolution that is attainable with the PMMA photoresist. The elemental content of a cell might be mapped by using different plasma generating materials.

What is claimed is:

1. A method for high resolution exposure of photoresist on integrated circuit wafers comprising the steps of:
   positioning a circuit wafer to be exposed close to a pair of crossed conductors that cross and contact each other at a cross point; and
   supplying a high current pulse to said conductors to cause them to vaporize, and breakdown into an ionized plasma and form a pinched x-ray source spot at the cross point and to thereby radiate said circuit wafer with said x-ray source to expose said circuit wafer.

2. The method of claim 1, wherein the step of positioning a circuit wafer comprises positioning a plurality of circuit wafers symmetrically about the cross point so that said plurality of wafers are exposed simultaneously by said x-ray source.

3. The method of claim 1, further comprising the step of disposing a patterned x-ray mask between said circuit wafer and said cross point before supplying the high current pulse to said conductors.

4. The method of claim 3, further comprising the step of placing a filter between said x-ray mask and said cross point to modify the incident photon energy spectrum on the wafers.

5. The method of claim 1, wherein the step of supplying a high current pulse comprises supplying a 500–600 kamp pulse for approximately 40 nanoseconds.

6. A method for high resolution exposure of photoresist on integrated circuit wafers comprising the steps of:
   positioning a circuit wafer to be exposed close to a pair of crossed liquid streams that cross and contact each other at a cross point; and
   supplying a high current pulse to said liquid streams to cause them to vaporize, breakdown into an ionized plasma and form a pinched x-ray source spot at the cross point and to thereby radiate said circuit wafer with said x-ray source to expose said circuit wafer.

7. The method of claim 6, wherein the step of positioning a circuit wafer comprises positioning a plurality of circuit wafers symmetrically about the cross point so that said plurality of wafers are exposed simultaneously by said x-ray source.

8. The method of claim 6, further comprising the step of disposing a patterned x-ray mask between said circuit wafer and said cross point before supplying the high current pulse to said liquid streams.

9. The method of claim 8, further comprising the step of placing a filter between said x-ray mask and said cross point to modify the incident photon energy spectrum on the wafers.

10. The method of claim 6, wherein the step of supplying a high current pulse comprises supplying a 500–600 kamp pulse for approximately 40 nanoseconds.

11. A method for high resolution exposure of photoresist on integrated circuit wafers comprising the steps of:
    positioning at least a first circuit wafer close to a pair of electrodes;
    positioning a first pair of crossed conductors that cross and contact each other at a cross point so that opposite ends of each conductor are in electrical contact with a different one of said pair of electrodes;
    supplying a high current pulse to said pair of electrodes to cause said first pair of crossed conductors to vaporize, breakdown into an ionized plasma and form a first pinched x-ray source spot at their cross point and to thereby radiate said at least first circuit wafer with said first x-ray source to expose to said first circuit wafer;
    positioning at least a second circuit wafer close to said pair of electrodes;
    positioning a second pair of cross conductors that cross and contact each other at a cross point so that opposite ends of each conductor in said second pair are in electrical contact with a different one of said pair of electrodes; and,
    supplying a high current pulse to said pair of electrodes to cause said second pair of crossed conductors to vaporize, breakdown into an ionized plasma and form a second pinched x-ray source spot at their cross point and to thereby radiate said at least said second circuit wafer with said second x-ray source to expose said second circuit wafer.

12. The method of claim 11, wherein the steps of positioning circuit wafers comprise positioning a first and a second plurality of circuit wafers symmetrically about the cross points of said first and second pair of crossed conductors, respectively, so that said first plurality of wafers are exposed simultaneously by said first x-ray source and said second plurality of wafers are exposed simultaneously by said second x-ray source.

13. The method of claim 11 further comprising the steps of disposing patterned x-ray masks between said first and second circuit wafers and said cross points of said first and second pairs of crossed conductors, respectively, before supplying the high current pulse to said electrodes.

14. The method of claim 13, further comprising the steps of placing filters between said x-ray mask and said cross points to modify the incident photon energy spectrum on the wafers.

15. The method of claim 11, wherein the steps of supplying high current pulses each comprise supplying a 500-600 kamp pulse for approximately 40 nanoseconds.

* * * * *

UNITED STATES PATENT AND TRADEMARK OFFICE
CERTIFICATE OF CORRECTION

PATENT NO. : 5,102,776

DATED : April 7, 1992

INVENTOR(S) : DAVID A. HAMMER ET AL.

It is certified that error appears in the above-identified patent and that said Letters Patent is hereby corrected as shown below:

Column 1, line 6:

In the printed patent please insert the following paragraph before the first paragraph of the specification at column 1, line 6:

--This invention was made with Government support under Grant Contract No. N00014-89-J2009, awarded by the Office of Naval Research. The Government has certain rights in the invention.--

Signed and Sealed this

Third Day of August, 1993

Attest:

MICHAEL K. KIRK

*Attesting Officer*  *Acting Commissioner of Patents and Trademarks*